(12) United States Patent
Kerrigan et al.

(10) Patent No.: US 7,854,781 B2
(45) Date of Patent: Dec. 21, 2010

(54) MOUNT FOR AIR FILTER AND BEZEL ASSEMBLY

(75) Inventors: Brian M. Kerrigan, Cary, NC (US); William Mark Megarity, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 658 days.

(21) Appl. No.: 11/796,766

(22) Filed: Apr. 30, 2007

(65) Prior Publication Data

US 2008/0265723 A1 Oct. 30, 2008

(51) Int. Cl.
*B01D 46/10* (2006.01)

(52) U.S. Cl. .......................... 55/385.6; 55/493; 55/494; 55/506; 55/DIG. 31; 55/DIG. 35; 55/481; 454/184; 454/192; 361/692; 361/695; 361/679.48

(58) Field of Classification Search ............... 55/385.6, 55/493, DIG. 31, DIG. 35, 494, 511, 506, 55/481; 454/184, 192; 361/692, 695, 679.48
See application file for complete search history.

(56) References Cited

U.S. PATENT DOCUMENTS

| | | | | | |
|---|---|---|---|---|---|
| 943,298 | A | * | 12/1909 | Brown | 454/332 |
| 1,660,168 | A | * | 2/1928 | Kimball | 160/91 |
| 2,175,195 | A | * | 10/1939 | Irvine | 55/509 |
| 2,624,405 | A | * | 1/1953 | Lynch | 160/353 |
| 3,063,224 | A | * | 11/1962 | Getzin | 55/493 |
| 3,636,683 | A | * | 1/1972 | Francis et al. | 55/493 |
| 4,217,122 | A | * | 8/1980 | Shuler | 55/480 |
| 4,737,174 | A | * | 4/1988 | Pontius | 96/138 |
| 5,458,772 | A | * | 10/1995 | Eskes et al. | 210/238 |
| 5,935,282 | A | * | 8/1999 | Lin | 55/385.6 |
| 6,267,793 | B1 | * | 7/2001 | Gomez et al. | 55/385.2 |
| 6,309,437 | B1 | | 10/2001 | Jones | |
| 6,354,936 | B1 | * | 3/2002 | Noh et al. | 454/201 |
| 6,362,417 | B2 | * | 3/2002 | Mitchell et al. | 174/384 |
| 6,589,308 | B1 | | 7/2003 | Gianelo | |
| 6,610,922 | B1 | * | 8/2003 | Twiss et al. | 174/390 |
| 6,746,502 | B2 | | 6/2004 | Yair et al. | |
| 6,896,611 | B2 | * | 5/2005 | Giraldo et al. | 454/184 |
| 6,924,975 | B2 | | 8/2005 | Lai | |
| 6,927,968 | B2 | | 8/2005 | Pols Sandhu et al. | |
| 7,038,124 | B1 | * | 5/2006 | Sosnowski | 174/383 |
| 7,466,545 | B2 | * | 12/2008 | Hung | 361/679.48 |
| 7,499,275 | B2 | * | 3/2009 | Lai et al. | 361/695 |
| 7,572,307 | B2 | * | 8/2009 | Coburn | 55/332 |
| 7,609,517 | B2 | * | 10/2009 | Sun | 361/692 |

* cited by examiner

*Primary Examiner*—Duane Smith
*Assistant Examiner*—Minh-Chau Pham
(74) *Attorney, Agent, or Firm*—Edward J. Lenart; Cynthia G. Seal; Biggers & Ohanian, LLP

(57) ABSTRACT

A mount for a bezel/air filter assembly for use in mounting the bezel/air filter assembly directly to the rack or cabinet in which electrical equipment is mounted or contained. The mount is affixed to the rack or cabinet rather than to the electrical equipment mounted or contained in the rack or cabinet, making use of the normally unused frontal area along the rail forming the front of the rack or cabinet, maximizing air flow to the equipment mounted in the rack or contained in the cabinet and allowing greater packaging density. Also, by using the rack or cabinet (rather than the equipment) as a support element, the mount is substantially stronger than if the mount was affixed to the chassis.

4 Claims, 2 Drawing Sheets

MOUNT FOR AIR FILTER AND BEZEL ASSEMBLY

BACKGROUND OF THE INVENTION

The present invention relates to a lock for an air filter and/or bezel mounted to a rack for electrical equipment that can be mounted to or removed from the rack without using any tools. In more detail, the present invention relates to a lock that enables the user to mount and/or dismount the bezel and/or air filter from a rack or cabinet in which electrical equipment such as computer equipment, routers, switching, power conditioning, and other electrical equipment is mounted or contained without any need for the use of hand or power tools.

Air filtration has recently become a requirement for the chassis of certain communications equipment and is often desirable for many other types of electrical equipment. Specifically, certain computer servers used in communications include an air filter integral with the chassis front bezel assembly, and to meet flammability requirements, all chassis external parts including the bezel must be steel. As a result, the steel bezel and air filter assembly is relatively heavy such that mounting and dismounting the bezel and air filter assembly becomes problematical.

Another problem affecting the mounting of the bezel and air filter assembly to the rack or cabinet in which electrical equipment is mounted or contained relates to the strength of the mount. For instance, certain communications equipment is shipped to the location in which it is to be utilized in the rack or cabinet in which it is contained such that the bezel and air filter assembly must be mounted to the rack or cabinet in a manner that can withstand the rigors and shock of transporting the rack or cabinet. Also, NEBS standards require equipment and racks to sustain seismic shock without functional damage and while preventing personal injury, for instance, from shock-induced failure of the bezel and air filter assembly mount.

To address the problems resulting from the substantial mass of the bezel and air filter assembly, screws and/or bolts can be used to mount the heavy bezel to the chassis. However, there is a need to maximize thermal inflow area, and the use of screws and bolts to mount the filter/bezel results decreases air flow due to reduced frontal area. The use of screws and bolts also compromises the human factors/usability of the design. In addition to the need for tools to remove the screws and bolts, there is a need for improved access to chassis (shelf) subcomponents mounted or contained in the rack or cabinet.

It is, therefore, an object of the present invention to provide a mount for a bezel and air filter assembly that meets all applicable safety requirements while maximizing thermal inflow area.

Another object of the present invention is to provide a mount for a bezel and air filter assembly that enables the bezel and air filter assembly to be mounted and/or dismounted without using tools.

Although described herein as being particularly useful for use as a mount on the chassis for communications servers, those skilled in the art will recognize from this disclosure that the bezel/air filter assembly mount of the present invention is also intended for use with racks and cabinets for other types of electrical equipment such as routers, switching, and power conditioning equipment. Consequently, in a broader sense, the present invention provides a mount for use in connection with any equipment rack or cabinet for which there is a need for air filtration and air flow.

In this regard, it is an object of the present invention to utilizes "unused" spatial area within the rack flange area to provide the advantages of thermal improvement, serviceability improvement, and shock and vibration resistance without the disadvantage of having to use valuable chassis frontal area to provide those features. This object is accomplished by using the rack flange, or EIA rail, area to lock, retain, and support the bezel/air filter assembly.

Other objects, and the many advantages of the present invention, will be made clear to those skilled in the art in the following detailed description of the preferred embodiment(s) of the invention and the drawings appended hereto. Those skilled in the art will recognize, however, that the embodiment(s) of the present invention that are described herein are only examples of specific embodiment(s), set out for the purpose of describing the making and using of the present invention, and that the embodiment(s) shown and/or described herein are not the only embodiment(s) of a targeted on/off switching system and method constructed and/or performed in accordance with the teachings of the present invention.

SUMMARY OF THE INVENTION

The present invention addresses the above-described problems by providing a mount for mounting the bezel and air filter assembly to a rack or cabinet for electrical equipment comprising a first plate adapted for mounting to the rail of a cabinet or rack for electrical equipment, a second plate slidably mounted to the first plate, and a rotating latch mounted to the first plate and having a pin thereon. A slot is formed in the second plate for receiving the pin on the rotating latch, the slot in the second plate being oriented so that sliding movement of the second plate relative to the first plate causes the rotating latch to pivot relative to the first plate. When rotated by sliding the second plate relative to the first plate, the rotating latch is pivoted so as to engage, or cover, a portion of the front surface of a bezel or to disengage the bezel that is mounted to the rack.

BRIEF DESCRIPTION OF THE DRAWINGS

Referring now to the figures.

DETAILED DESCRIPTION OF THE PREFERRED EMBODIMENT(S)

Figure 1:
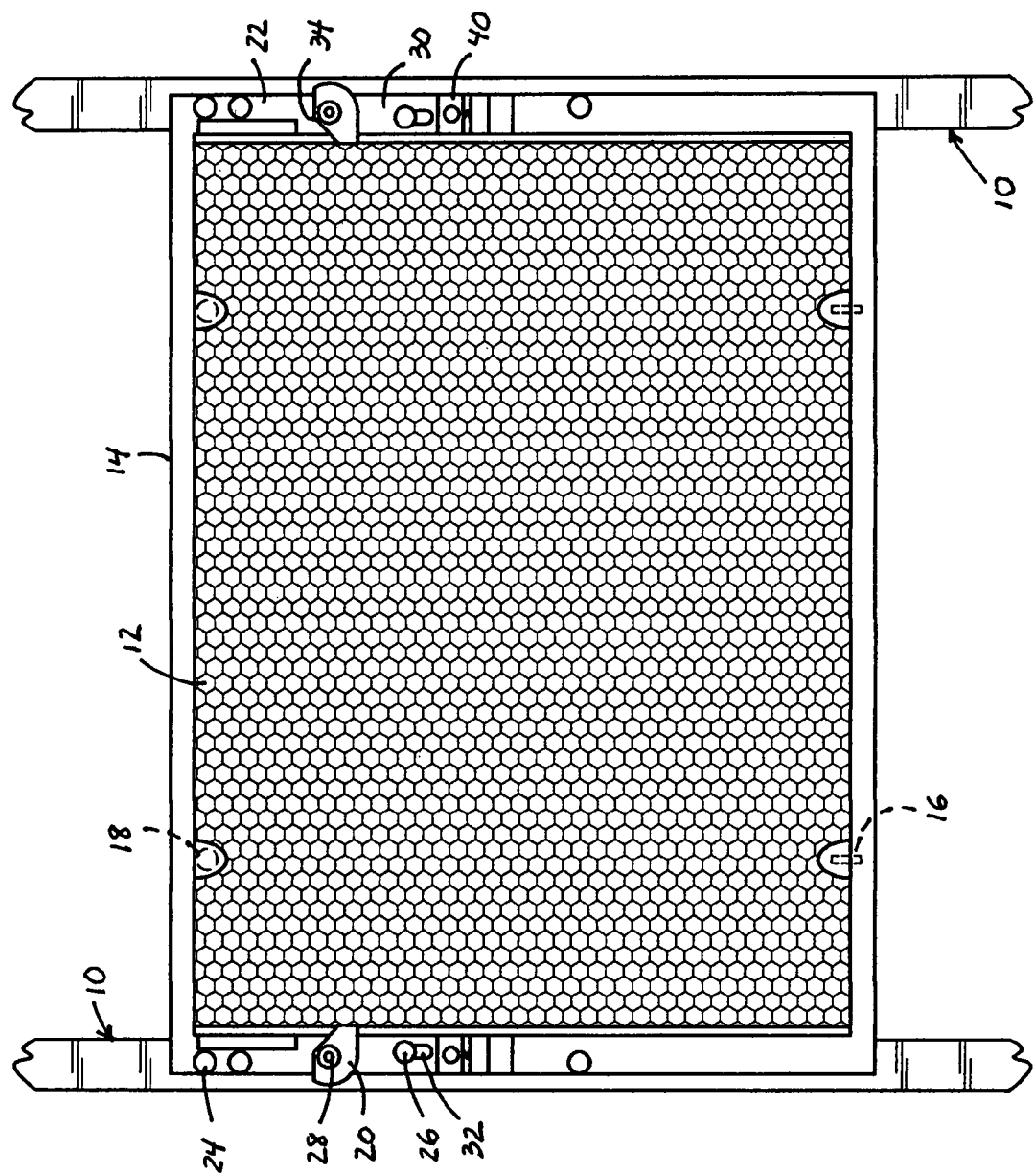
FIG. 1 is a front elevational view of a mount for a bezel and air filter assembly that is constructed in accordance with the present invention, the bezel and air filter assembly being mounted to the vertical side rail of a rack or cabinet for electrical equipment (the rail being shown in cutaway view due to the size of the rack).

In more detail, and referring now to the figures, the vertical side rail of an electrical equipment rack of the type that is commonly utilized for mounting electrical equipment such as computer equipment, routers, switching, power conditioning, and other electrical equipment is shown at reference numeral 10. Those skilled in the art will recognize that the particular side rail shown is a type commonly referred to as the EIA rail or mounting flange in accordance with ANSI/EIA standard EIA-310-D, but as noted above, the locking mechanism of the present invention is intended for use with all types of racks and cabinets in which computer and non-computer equipment is mounted or contained and in which there is a need to maximize frontal area for cooling inflow, improved access, and improved serviceability. In the particular embodiment shown, an air filter 12 is mounted behind a bezel 14 that is mounted/dismounted from the side rails 10 of the rack utilizing the mount of the present invention. One or more mounting hooks 16 and clips 18 are provided on either the rack or cabinet or the bezel to align and temporarily hold bezel 14 to the chassis of the rack or cabinet and then the latch 20 (described in more detail below) is rotated into contact with the surface and covering a portion of the front of bezel 14 to releasably latch the bezel 14 to the rack. To release the bezel, and as will be apparent from the following description, once the rotating latch 20 is rotated to the open, or released position, the bezel 14 is removed from the rack or cabinet by pulling away from the rails 10.

Figure 2B:
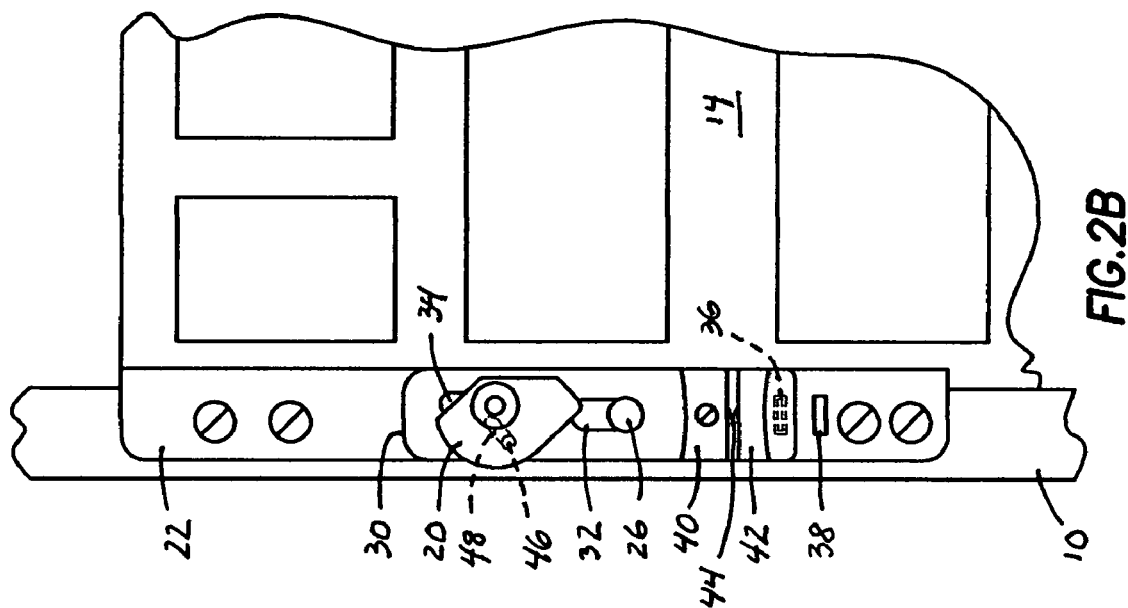
FIGS. 2A and 2B enlarged views of the lock constructed in accordance with the present invention as shown in FIG. 1 in the closed and opened positions, respectively.
Figure 2A:
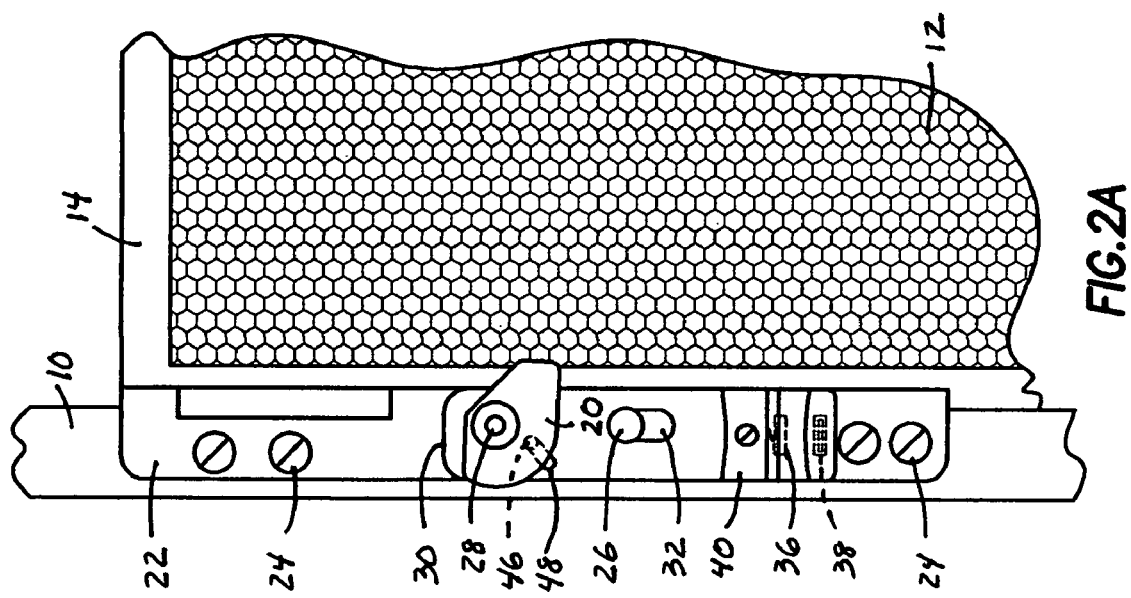

Referring now to FIGS. 2A and 2B, the locking mechanism is shown in more detail. A first elongate plate 22 is mounted to the rail 10 of the equipment rack or cabinet in a manner appropriate to the construction of the particular rack or cabinet, a plurality of screws 24 being utilized in the embodiment shown. A shoulder rivet 26 and the pin 28 on which latch 20 rotates are affixed to plate 22. A second elongate plate 30 is closely approximated and retained to first plate 22 by the shoulder rivet 26 and the latch 20 mounted on pin 28, slots 32 and 34 in second plate 30 being provided for each of rivet 26 and pin 28, respectively, to allow sliding movement of second plate 30 relative to first plate 22. First and second detents 36 and 38 are provided in first plate 22 for receiving a complimentary-shaped tab (obscured by other structure in the figures) that is integral with the stop 40 mounted to second plate 30 for a purpose described below. Stop 40 is biased away from finger rest 42 by a spring 44 (a coil spring being shown in the figures, but those skilled in the art will recognize from this description that a leaf spring or even a compressible elastomeric substance confined in the space between stop 40 and finger rest 42 will function in the intended manner (described below). Although obscured by other structure such that it is shown in shadow lines, a pin 46 is provided on the side of rotating latch 20 that is adjacent the surface of second plate 30. Pin 46 resides in an angled slot 48 formed in second plate 30 so that movement of second plate 30 relative to first plate 22 causes pin 46 to exert force on the margins of the slot 48 in which it resides, causing latch 20 to rotate into and out of engagement with the surface of the bezel 14.

Having described the structure of the preferred embodiment of the latching mechanism of the present invention, the operation of that mechanism will now be described. After positioning the bezel 14 and air filter 12 against the rail 10 of the cabinet or equipment rack using the above-described hooks 16 and clips 18, the operator squeezes against stop 40 and finger rest 42 to rock the tab of stop 40 out of the lower detent 38 and then exerts upward pressure against the stop 40 to slide the second plate 30, to which stop 40 is mounted, upwardly relative to first plate 22. Second plate is moved upwardly in this fashion until the tab of stop 40 registers in upper detent 36, at which time it lands in that detent 36 to retain second plate 30 in that raised position. As will be apparent from the above description of the pin 46 and angled slot 48, upward movement of second plate 30 relative to first plate 22 causes latch 20 to rotate in the counterclockwise direction (in the embodiment shown in the figures) into engagement with and covering a portion of the surface of bezel 14, thereby retaining bezel 14 to the rail 10. To remove the bezel 14 from rail 10, the operator again squeezes against stop 40 and finger rest 42 to remove the tab of stop 40 from the upper detent 36 and then pushes down on finger rest 42 to slide second plate 30 downwardly until the tab of stop 40 lands in second detent 38. In the embodiment shown, downward sliding movement of second plate 30 causes latch 20 to rotate in the clockwise direction (in the embodiment shown in the figures) out of contact with bezel 14 so that bezel 14 can then be removed from the rail 10 of the cabinet or equipment rack.

Those skilled in the art who have the benefit of this disclosure will recognize that certain changes can be made to the component parts of the apparatus of the present invention without changing the manner in which those parts function and/or interact to achieve their intended result. By way of example, those skilled in the art who have the benefit of this disclosure will recognize that the pin 46 on latch 20 could instead be formed integrally with second plate 30 and that the angled slot 48 of second plate 30 can be formed in rotating latch 20 and that the two parts will function in the same manner described. Likewise, although the shoulder rivet 26 is described herein as being mounted on first plate 22, the same function can be achieved by mounting that rivet on the second plate for movement in a slot formed in the first plate. Similarly, it will be recognized that the terms "upwardly" and "downwardly" as used herein are terms that are consistent with the structure of the preferred embodiment of the latching mechanism of the present invention that is shown in the figures but that in other applications, the directions of movement may be reversed or that the direction of movement may be from side-to-side, or laterally. All such changes, and others that will be clear to those skilled in the art from this description of the preferred embodiment(s) of the invention, are intended to fall within the scope of the following, non-limiting claims.

What is claimed is:

1. A mount for a bezel of an electrical equipment rack comprising:
    a first plate mounted to the electrical equipment rack;
    a second plate slidably mounted to the first plate;
    a rotating latch mounted to the first plate and having a pin thereon; and
    a slot formed in the second plate for receiving the pin on the rotating latch, the slot in the second plate being oriented so that sliding movement of the second plate relative to the first plate causes the rotating latch to pivot relative to the first plate.

2. The mount of claim 1 wherein either the first or the second plate is provided with a prong and the other of the first or the second plate is provided with a detent for receiving the prong for resisting relative movement of the first and second plates.

3. The mount of claim 1 wherein either the first or the second plate is provided with a shoulder rivet and the other of the first or the second plate is provided with a slot for receiving the shoulder rivet for guiding sliding movement of the second plate relative to the first plate.

4. The mount of claim 1 additionally comprising a lock actuator mounted to the second plate.

* * * * *